United States Patent
Yu et al.

(10) Patent No.: US 11,189,340 B1
(45) Date of Patent: Nov. 30, 2021

(54) CIRCUIT IN MEMORY DEVICE FOR PARASITIC RESISTANCE REDUCTION

(71) Applicant: Taiwan Semiconductor Manufacturing Co., Ltd., Hsin-Chu (TW)

(72) Inventors: Dian-Sheg Yu, Hsinchu (TW); Jhon Jhy Liaw, Hsinchu County (TW); Ren-Fen Tsui, Taipei (TW); Bing-Chian Lin, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/888,509

(22) Filed: May 29, 2020

(51) Int. Cl.
*G11C 11/41* (2006.01)
*G11C 11/418* (2006.01)
*H01L 27/11* (2006.01)
*G11C 11/419* (2006.01)
*H01L 23/528* (2006.01)

(52) U.S. Cl.
CPC .......... *G11C 11/418* (2013.01); *G11C 11/419* (2013.01); *H01L 23/528* (2013.01); *H01L 27/1104* (2013.01); *H01L 27/1116* (2013.01)

(58) Field of Classification Search
None
See application file for complete search history.

(56) References Cited

U.S. PATENT DOCUMENTS

| 8,605,523 | B2 | 12/2013 | Tao et al. | |
|---|---|---|---|---|
| 8,630,132 | B2 | 1/2014 | Cheng et al. | |
| 8,760,948 | B2 | 6/2014 | Tao et al. | |
| 2004/0027852 | A1* | 2/2004 | Watanabe | G11C 11/419 |
| | | | | 365/154 |
| 2012/0014172 | A1* | 1/2012 | Jung | G11C 11/413 |
| | | | | 365/154 |
| 2014/0032871 | A1 | 1/2014 | Hsu et al. | |
| 2014/0153321 | A1 | 6/2014 | Liaw | |
| 2014/0153345 | A1 | 6/2014 | Kim et al. | |
| 2014/0177352 | A1 | 6/2014 | Lum | |
| 2014/0233330 | A1 | 8/2014 | Ko et al. | |
| 2014/0241077 | A1 | 8/2014 | Katoch et al. | |
| 2014/0269114 | A1 | 9/2014 | Yang et al. | |
| 2017/0372793 | A1* | 12/2017 | Walker | G11C 29/46 |

\* cited by examiner

*Primary Examiner* — Tan T. Nguyen
(74) *Attorney, Agent, or Firm* — Haynes and Boone, LLP (57) ABSTRACT

A memory device includes a plurality of memory cells located in a first region of the memory device. The memory cells include a first signal line, a first circuit located in the first region of the memory device, and a plurality of logic circuits located in a second region of the memory device. The second region and the first region have different design rules. The first circuit is configured to be selectively enabled and disabled. When the first circuit is enabled, the first signal line is electrically coupled in parallel with a second signal line.

20 Claims, 9 Drawing Sheets

CIRCUIT IN MEMORY DEVICE FOR PARASITIC RESISTANCE REDUCTION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, in memory devices such as Static Random Access Memory (SRAM) devices, it may be desirable to pack numerous SRAM cells in an array, so as to increase the array efficiency and/or to reduce the chip size. However, a long SRAM array may increase the parasitic resistance attributed to the metal routing. For example, a bit line (BL) or bit line bar (BLB) signal line of an SRAM array may produce a high parasitic resistance. A sufficiently high parasitic resistance may cause various performance issues for SRAM devices, for example a low write margin, which will cause an undesirable voltage drop across the length of the BL or BLB signal line. In some cases, an SRAM cell the end of an SRAM array may experience a degraded logic high or low voltage for its BL or BLB signal line, which may worsen device performance.

Therefore, although conventional memory devices have been generally adequate for their intended purposes, they are not satisfactory in every respect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Figure 1:
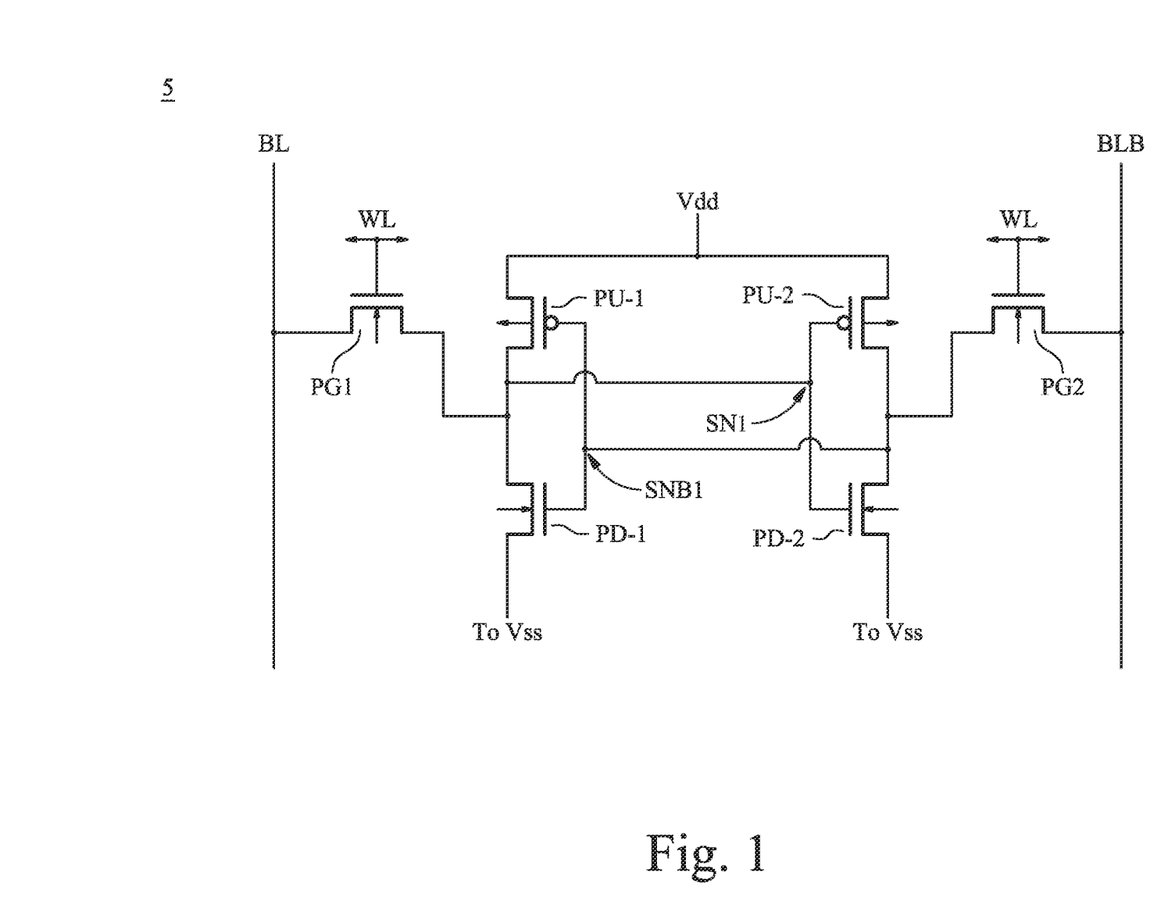
FIG. 1 is a circuit diagram of an SRAM cell according to various aspects of the present disclosure.

The present disclosure is directed to, but not otherwise limited to, a static random access memory (SRAM) device. An SRAM device is a type of semiconductor memory that uses bi-stable latching circuitry (e.g., flip-flop) to store binary bits of information. FIG. 1 illustrates an example circuit schematic for a single-port SRAM cell (e.g., 1-bit SRAM cell) 5. The single-port SRAM cell 5 includes pull-up transistors PU1, PU2; pull-down transistors PD1, PD2; and pass-gate transistors PG1, PG2. As show in the circuit diagram, transistors PU1 and PU2 are p-type transistors, such as the p-type FinFETs discussed above, and transistors PG1, PG2, PD1, and PD2 are n-type FinFETs discussed above.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vdd (also referred to as Vcc), and the sources of the pull-down transistors PD1 and PD2 are coupled to a voltage Vss, which may be an electrical ground in some embodiments.

The first storage node SN1 of the first data latch is coupled to bit line (BL) through pass-gate transistor PG1, and the complementary first storage node SNB1 is coupled to complementary bit line (also referred to as bit line bar, or BLB) through pass-gate transistor PG2. The first storage node SN1 and the complementary first storage node SNB1 are complementary nodes that are often at opposite logic levels (logic high or logic low). Gates of pass-gate transistors PG1 and PG2 are coupled to a word line WL.

According to the various aspects of the present disclosure, SRAM devices such as the SRAM cell 5 may be implemented using "planar" transistor devices and/or with FinFET devices. In that regard, a FinFET device is a fin-like field-effect transistor device, which has been gaining popularity recently in the semiconductor industry. FinFET devices offer several advantages over traditional Metal-Oxide Semiconductor Field Effect Transistor (MOSFET) devices (e.g., "planar" transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

The FinFET device may be a complementary metal-oxide-semiconductor (CMOS) device including a P-type metal-oxide-semiconductor (PMOS) FinFET device and an N-type metal-oxide-semiconductor (NMOS) FinFET device. It is understood that some aspects (e.g., SRAM cells or voltage control circuits) of the following disclosure may be implemented using FinFET devices, but it is understood that the application is not limited to FinFET devices, except as specifically claimed. An example FinFET device and the fabrication thereof is described in more detail in U.S. Pat. No. 9,711,533, entitled "FINFET DEVICES HAVING DIFFERENT SOURCE/DRAIN PROXIMITIES FOR INPUT/OUTPUT DEVICES AND NON-INPUT/OUTPUT DEVICES AND THE METHOD OF FABRICATION THEREOF", which was filed on Oct. 16, 2015 and issued on Jul. 18, 2017, the disclosure of which is hereby incorporated by reference in its entirety.

Figure 2:
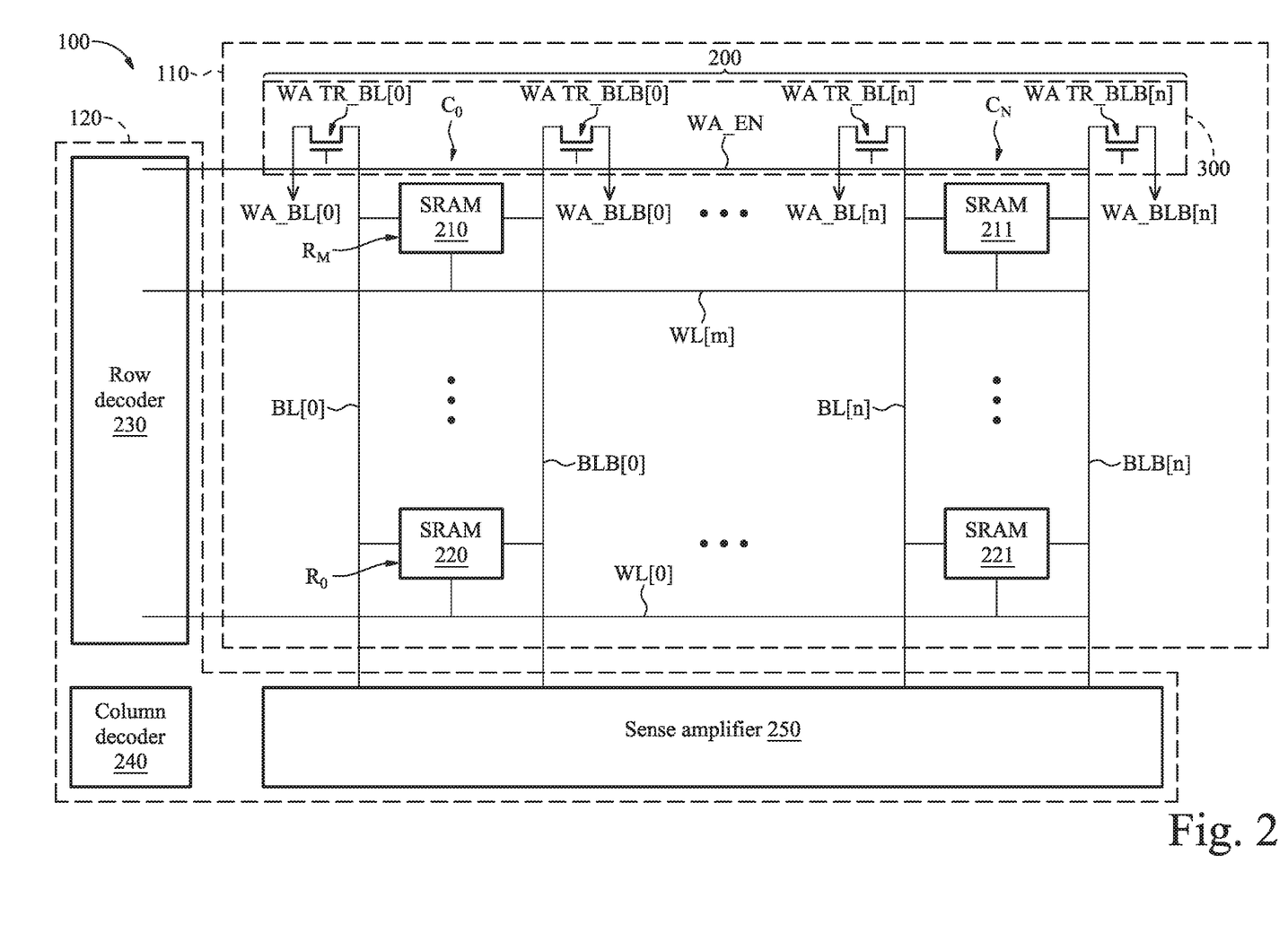
FIGS. 2-3 are simplified circuit diagrams memory device according to various aspects of the present disclosure.
Figure 3:
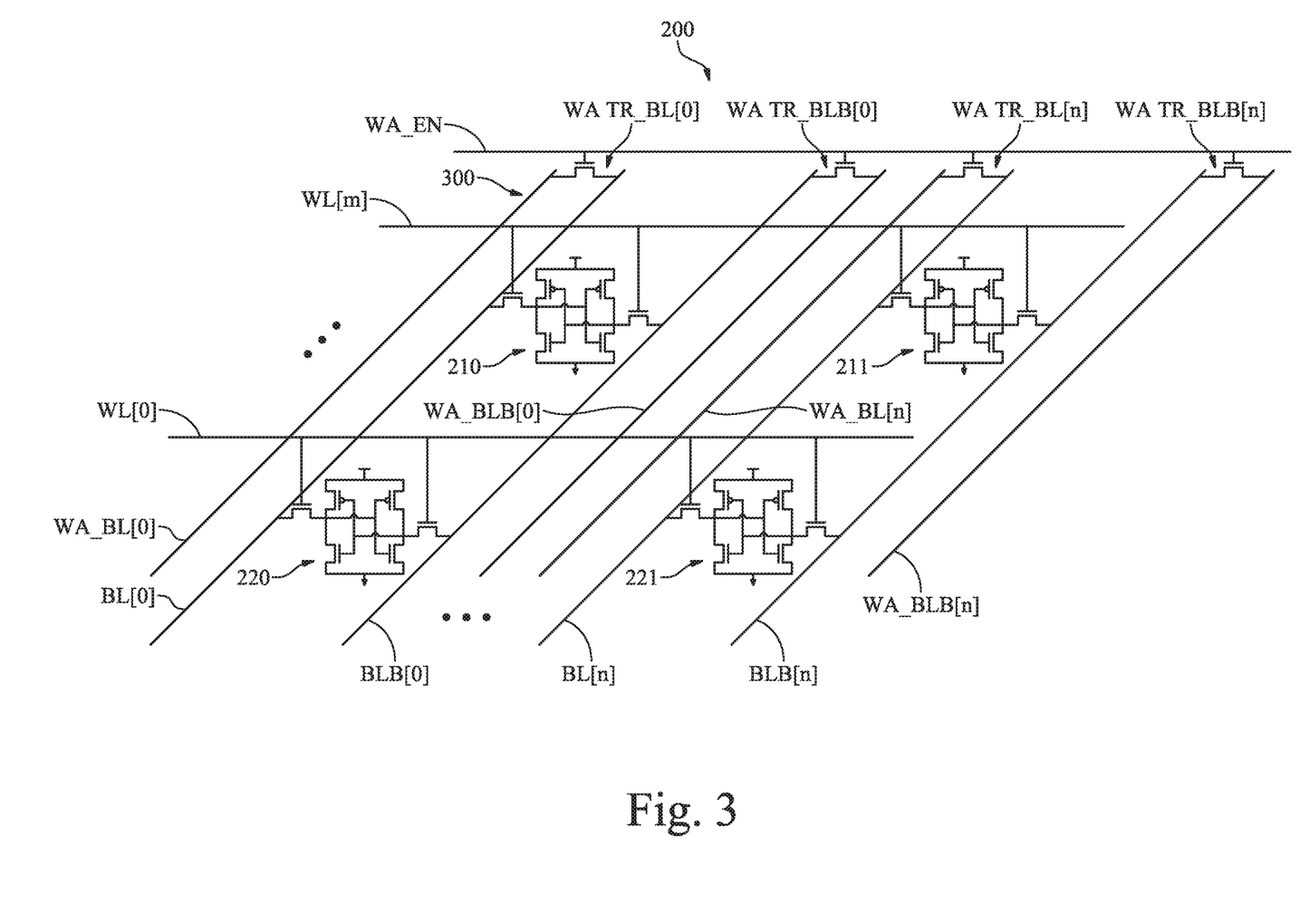

FIGS. 2-3 illustrate simplified diagrams of a memory device 100 according to various aspects of the present disclosure. The memory device 100 includes an SRAM cells array 200 that includes M rows and N columns of SRAM cells, where M and N are integers. For example, the row $R_M$ (the topmost row shown in FIG. 2) includes a plurality of SRAM cells that are horizontally disposed with respect to one another. For reasons of simplicity, the first SRAM cell 210 and the last SRAM cell 211 in the row $R_M$ are shown in FIG. 2, and the rest of the SRAM cells disposed between the SRAM cells 210 and 211 are represented by a plurality of dots in FIG. 2 but otherwise omitted. Similarly, the row $R_0$ (the bottommost row shown in FIG. 2) includes a plurality of SRAM cells that are horizontally disposed with respect to one another. For reasons of simplicity, the first SRAM cell 220 and the last SRAM cell 221 in the row $R_0$ are shown in FIG. 2, and the rest of the SRAM cells disposed between the SRAM cells 220 and 221 are represented by a plurality of dots in FIG. 2 but otherwise omitted. It is also understood that a plurality of rows of SRAM cells exist between the row $R_0$ and the row $R_M$, which are also represented by a plurality of dots in FIG. 2 but otherwise omitted.

Referring still to FIGS. 2-3, each of the rows of the SRAM cells array 200 is electrically coupled to a respective word line (WL) signal. For example, each of the SRAM cells in the row $R_0$ is electrically coupled to the WL signal WL[0], and each of the SRAM cells in the row $R_M$ is electrically coupled to the WL signal WL[m]. The rows that exist between the rows $R_0$ and $R_M$ are each electrically coupled to a respective one of the WL signals too.

The SRAM cells array 200 may also be described from the perspective of columns. For example, the column $C_0$ (the leftmost column shown in FIG. 2) includes a plurality of SRAM cells that are vertically disposed with respect to one another, including the SRAM cells 210 and 220. The column $C_N$ (the rightmost column shown in FIG. 2) also includes a plurality of SRAM cells that are vertically disposed with respect to one another, including the SRAM cells 211 and 221. Again, there are a plurality of SRAM cells disposed between the SRAM cells 210-220, as well as between the SRAM cells 211-221. There is also a plurality of columns of SRAM cells between the columns $C_0$ and $C_N$. These additional SRAM cells are represented by the dots but otherwise omitted in FIG. 2.

Referring still to FIGS. 2-3, each of the columns of the SRAM cells array 200 is electrically coupled to a respective bit line (BL) signal line and a respective bit line bar (BLB) signal line. For example, each of the SRAM cells in the column $C_0$ is electrically coupled to the BL[0] signal line on its left and the BLB[0] signal line on its right, and each of the SRAM cells in the column $C_N$ is electrically coupled to the BL[n] signal line on its left and the BLB[n] signal line on its right, and the columns that exist between the columns $C_0$ and $C_N$ are each electrically coupled to a respective one of the BL and BLB signal lines too.

In some embodiments, the SRAM cells of the SRAM cells array (e.g., SRAM cells 210-211 and 220-221) may each be implemented as a single-port SRAM cell 5 of FIG. 1. In other embodiments, the SRAM cells 210-211 and 220-221 may each be implemented as a dual-port SRAM cell. In any case, the SRAM cells array 200 is located in a SRAM region 110 of the memory device 100, as shown in FIG. 2.

The memory device 100 may further include electrical circuits such as a row decoder 230 for addressing (or accessing) the individual rows of the SRAM cells array 200, a column decoder 240 for addressing (or accessing) the individual columns of the SRAM cells array 200, and a sense amplifier 250 for converting or amplifying a low power signal from the BL and/or BLB (e.g., a weak differential signal) into a recognizable logic 1 or logic 0 signal. In some embodiments, the row decoder 230 and/or the column decoder 240 may be configured to generate the WL signals and/or other control signals. In other embodiments, other types of logic circuitry such as write drivers may be used to generate the WL signals and/or other control signals. The row decoder 230, the column decoder 240, and the sense amplifier 250 are all located in a logic circuit region 120 of the memory device 100, which is separate from the SRAM region 110, as clearly shown in FIG. 2. The logic circuit region 120 may include other types of logic circuits, such as driver circuits, shifter registers, address generators, and/or controllers that may produce various control and/or timing signals.

According to various aspects of the present disclosure, the SRAM cells array 200 may also include a circuit 300 that is also located in the SRAM region 110 (and not in the logic circuit region 120). The circuit 300 includes a row of write assist devices. For example, the write assist devices may include a plurality of write assist transistors such as transistors WA TR_BL[0], WA TR_BLB[0], WA TR_BL[n], and WA TR_BLB[n]. It is understood that a pair of these write assist transistors is implemented for each column of the SRAM cells array 200. For example, the write assist transistors WA TR_BL[0] and WA TR_BLB[0] are implemented for the column $C_0$, and the write assist transistors WA TR_BL[n] and WA TR_BLB[n] are implemented for the column $C_N$. It is understood that a plurality of other pairs of similar write assist transistors are implemented between the write assist transistors WA TR_BLB[0] and WA TR_BL[n], but they are not specifically illustrated herein for reasons of simplicity. It is also understood that the layout of each of these write assist transistors WA TR_BLB[0] and WA TR_BL[n] is similar to the layout of an SRAM cell, which helps to improve fabrication processing due to better pattern uniformity.

As will be discussed later in more detail, the circuit 300 is configured to reduce the parasitic resistance associated with the bit line (BL) and bit line bar (BLB) signals. The gates of the transistors WA TR_BL[0], WA TR_BLB[0], WA TR_BL[n], and WA TR_BLB[n] are each connected to a control signal "write assist enable" (denoted as WA_EN in FIGS. 2-3). The control signal WA_EN may be generated by a logic circuit that is located in the logic circuit region 120, for example by a driver, by the row decoder 230, by the column decoder 240, or by another type of logic circuit in various embodiments. The control signal WA_EN turns on or off all of the write assist transistors, such as the transistors WA TR_BL[0], WA TR_BLB[0], WA TR_BL[n], and WA TR_BLB[n]. For example, when the control signal WA_EN is at a logic high state, all of the write assist transistors WA TR_BL[0], WA TR_BLB[0], WA TR_BL[n], and WA TR_BLB[n] are turned on. Conversely, when the control signal WA_EN is at a logic low state, all of the write assist transistors WA TR_BL[0], WA TR_BLB[0], WA TR_BL[n], and WA TR_BLB[n] are turned off.

The write assist transistors WA TR_BL[0], WA TR_BLB[0], WA TR_BL[n], and WA TR_BLB[n] may each have a first source/drain and a second source/drain that is opposite the first source/drain. According to embodiments of the present disclosure, the first source/drains of the write assist transistors WA TR_BL[0], WA TR_BLB[0], WA TR_BL[n], and WA TR_BLB[n] are each connected to a BL or BLB signal line. For example, the first source/drain of the write assist transistor WA TR_BL[0] is connected to the BL[0] signal line, the first source/drain of the write assist transistor WA TR_BLB[0] is connected to the BLB[0] signal line, the first source/drain of the write assist transistor WA TR_BL[n] is connected to the BL[n] signal line, and the first source/drain of the write assist transistor WA TR_BLB[n] is connected to the BLB[n] signal line. In other words, each of the BL or BLB signal lines is connected to a corresponding first source/drain of a respective write assist transistor.

Meanwhile, the second source/drains of the write assist transistors WA TR_BL[0], WA TR_BLB[0], WA TR_BL[n], and WA TR_BLB[n] are each connected to a different signal line that is neither the BL signal line nor the BLB signal line, for example to the signal lines WA_BL[0], WA_BLB[0], WA_BL[n], WA_BLB[n], respectively. The signal lines WA_BL[0], WA_BLB[0], WA_BL[n], WA_BLB[n] may also be referred to as "write assist signal lines", and they are configured to provide an alternative path for the BL or BLB signal lines, which helps alleviate low write margin problems caused by parasitic resistance.

In more detail, the BL and BLB signal lines of the SRAM cells array 200 may be implemented using metal lines in a multilayer interconnect structure. As the device scaling process continues, parasitic resistance of the metal lines may adversely impact device performance. For example, parasitic resistance of a metal line varies based on the length of the metal line. As the length of the metal line increases, so does its parasitic resistance. In the case of an SRAM array such as the SRAM cells array 200 shown in FIGS. 2-3, the SRAM cells in each of the columns $C_0$-$C_N$ may not experience the same voltage on their BL and BLB signal lines. Typically, the SRAM cells located at the "far end" of the column (e.g., farthest away from the sense amplifier 250) may experience the highest parasitic resistance, since the length of the metal lines of BL and BLB is the greatest for these SRAM cells. According to Ohm's law (V=I*R), voltage varies as a function of resistance. As such, the "far end" SRAM cells (such as the SRAM cells 210 and 211) may experience the greatest voltage loss due to parasitic resistance.

This voltage loss problem caused by parasitic resistance is exacerbated when the columns $C_0$-$C_N$ become longer. For example, whereas a conventional SRAM cells array may have columns that each contain 16, 32, or 64 SRAM cells, modern day SRAM cells may have columns that each contain 128 or even 256 SRAM cells. Thus, in modern day SRAM devices, the voltage loss at the "far end" of the columns may be substantial enough to severely degrade the signals such as Vdd or Vss. For example, the voltage drop caused by parasitic resistance may degrade certain SRAM operating parameters or criteria, such as a minimum operating voltage (hereinafter referred to as Vmin or Vcc_min). In some cases, the degradation of the Vmin may be as high as a few hundred milli-volts (mV), particularly for SRAM cells at the "far end" of the column such as SRAM cells 210 or 211. If Vmin is not satisfied, a SRAM cell may experience degradations in speed and/or write margins, or read/write failures, access failures, and/or retention failures.

The present disclosure implements the circuit 300 to overcome the problems caused by voltage drop due to parasitic resistance. As discussed above, the circuit 300 may be considered to be embedded within the SRAM cells array 200 (because the circuit 300 is located in the SRAM region 110) and is electrically coupled to the BL and BLB signal lines. The circuit 300 provides an alternative current path for the BL and BLB signal lines during the "write" cycle of operation. In that regard, the SRAM cells array 200 has a "write" cycle of operation and a "read" cycle of operation. During a "write" cycle of the SRAM operation, the control signal WA_EN is at a first logic state such as a logic high state (e.g., a logic "1"). As such, the write assist transistors WA TR_BL[0], WA TR_BLB[0], WA TR_BL[n], and WA TR_BLB[n] are turned on, which means that the signal lines WA_BL[0], WA_BLB[0], WA_BL[n], WA_BLB[n] are electrically coupled in parallel to the signal lines BL[0], BLB[0], BL[n], and BLB[n], respectively. As the various BL and BLB signal lines now each have an extra electrical path, the parasitic resistance is reduced for the BL and BLB signal lines, for example by up to 50% in some embodiments. Alternatively stated, the parallel electrical coupling of the WA_BL[0], WA_BLB[0], WA_BL[n], WA_BLB[n] signal lines with their respective BL or BLB signal lines may be viewed as an effective increase in the area of the metal conductor that makes up the BL and BLB signal lines. Since parasitic electrical resistance is inversely correlated with the area of the metal conductor, the increase in size of the metal conductor causes a reduction in parasitic electrical resistance. And as voltage loss is directly correlated with parasitic resistance, the voltage loss is also reduced herein by the reduction of the parasitic resistance, thereby improving a write margin for the SRAM cells array 200.

Note that the embedding of the circuit 300 in the SRAM cells array 200 leads to chip area savings too. In more detail, had a write assist circuit (for improving write margins) been implemented using logic cells that are located in the logic circuit region 120, rather than within the SRAM region 110, such a write assist circuit may require a large amount of chip real estate, which is undesirable since it increases the size of the IC chip. In comparison, the embedding of the circuit 300 within an existing SRAM such as the SRAM cells array 200 does not incur much chip area penalty. For example, in embodiments where each column of the SRAM cells array 200 has 256 SRAM cells, the implementation of the row of write assist transistors such as WA TR_BL[0], WA TR_BLB[0], WA TR_BL[n], and WA TR_BLB[n] merely increases the effective length of the column by two SRAM cells, because the layout of the write assist transistors such as WA TR_BL[0], WA TR_BLB[0], WA TR_BL[n] may be substantially similar to the layout of an SRAM cell, and there are two of the write assist transistors per column. Therefore, the increase in the length of the column is roughly equal to 2/256=7.81%. In comparison, had a write assist circuit (e.g., similar to the circuit 300) been implemented in the logic circuit region 120 (e.g., in or near the sense amplifier 250), it would have required more chip space, since the design rules of the logic circuit region 120 demand greater spacing between components (e.g., fin-to-fin spacings, contact-to-contact spacings, metal-line-to-metal-line spacings, etc.) than the design rules of the SRAM cells array 200. In addition, implementing the write assist circuit in the logic circuit region 120 may also require long routing or metal interconnections to electrically couple the circuit 300 to the SRAM cells array 200, which is due at least in part to the separate locations between the SRAM cells array and the logic circuit region 120. In comparison, embedding the circuit 300 in the SRAM cells array 200 (as is done herein) does not require complex routing or metal interconnections, which further reduces chip area penalties compared to implementing the write assist circuit in the logic circuit region 120. Typically, implementing the write assist circuit in logic circuit region 120 (as may be done in some conventional devices) may lead to a chip area penalty of at least 10%. Furthermore, the similarity in layout between the SRAM cells and the write assist transistors such as WA TR_BL[0], WA TR_BLB[0], WA TR_BL[n], or WA TR_BLB[n] leads to better fabrication process control, since there is more pattern uniformity between the SRAM cells and these write assist transistors. It is understood that some conventional devices may not implement a write assist circuit, which means that it is possible that such a device may have a smaller chip area than the embodiments of the present disclosure. Unfortunately, such conventional devices may also suffer from excessive parasitic resistance, which is also undesirable. Therefore, conventional devices either do not implement a write assist circuit, which will lead to a greater parasitic resistance than the embodiments of the present disclosure, or they may implement a write assist circuit in the logic circuit region 120, which may lead to a greater chip area penalty than the embodiments of the present disclosure.

During the "read" cycle of the SRAM operation, the control signal WA_EN is at a second logic state, such as a logic low state (e.g., a logic "0"). As such, the write assist transistors WA TR_BL[0], WA TR_BLB[0], WA TR_BL[n], and WA TR_BLB[n] of the circuit 300 are turned off. Consequently, the "alternate path" signal lines WA_BL[0], WA_BLB[0], WA_BL[n], WA_BLB[n] are not electrically coupled to the BL or BLB signal lines and do not contribute extra parasitic capacitance to the SRAM cells array 200. Parasitic capacitance would have adversely affected the speed of the SRAM cells array 200, which may be an important performance criterion in the "read" cycle. Since the circuit 300 does not contribute to parasitic capacitance in the "read" cycle, its implementation does not unduly slow down the SRAM cells array 200.

It is understood that the signal lines WA_BL[0], WA_BLB[0], WA_BL[n], WA_BLB[n] need not be formed in the same metal layer as the BL and BLB signal lines. For example, in some embodiments, the BL and BLB signal lines may be formed in a metal-0 layer of an interconnect structure of the memory device 100, while the signal lines WA_BL[0], WA_BLB[0], WA_BL[n], WA_BLB[n] may be formed in a metal-2 layer (e.g., two metal layers above the metal-0 layer) of the interconnect structure. In other embodiments, however, the signal lines WA_BL[0], WA_BLB[0], WA_BL[n], WA_BLB[n] may be formed in the same metal layer (e.g., the metal-0 layer) as the BL and BLB signal lines.

Figure 4:
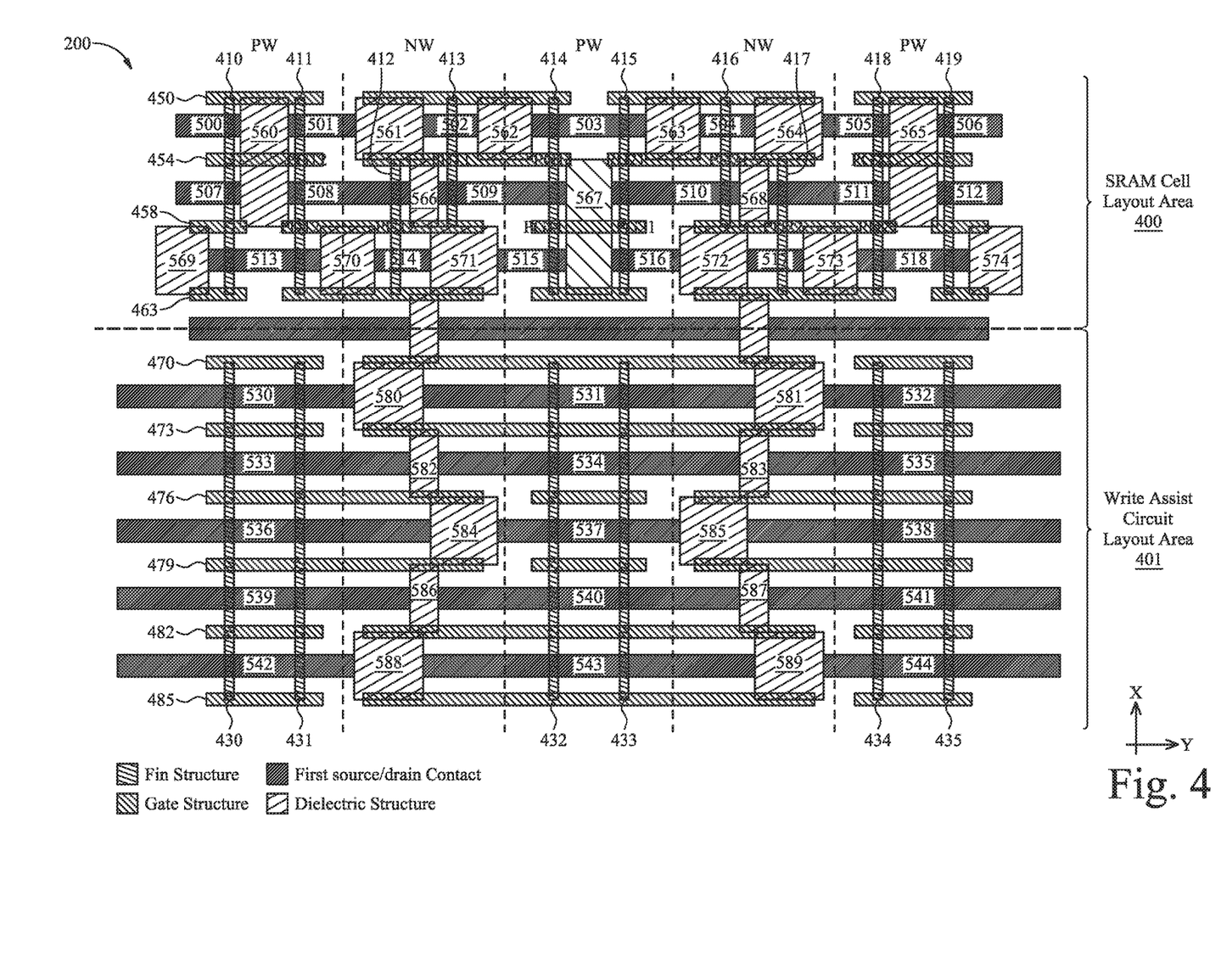
FIGS. 4-8 are simplified diagrammatic top view of a layout of a memory device according to various aspects of the present disclosure.

FIGS. 4-8 are diagrammatic fragmentary top views of a portion of the SRAM cells array 200 at various stages of fabrication. Referring to FIG. 4, the portion of the illustrated SRAM cells array 200 includes an SRAM cell layout area 400 and a write assist circuit layout area 401. The SRAM cell layout area 400 and the write assist circuit layout area 401 are both located within the SRAM region 110 (see FIG. 2) and not in the logic circuit region 120.

The portion of the SRAM cell layout area 400 illustrated in FIG. 4 includes two SRAM cells. One of the SRAM cells is formed by six transistors that include:

PG12, PD12, PU12, PG11, PD11, and PU11 (where PG stands for pass gate, PD stands for pull-down, and PU stands for pull up). The other one of the SRAM cells is formed by six other transistors that include: PG22, PD22, PU22, PG21, PD21, and PU21. These two SRAM cells are associated with different columns of SRAM cells. As discussed above with reference to FIGS. 2-3, each column of SRAM cells has two corresponding write assist transistors. Therefore, the portion of the write assist circuit layout area 401 illustrated in FIG. 4 includes four write assist transistors (i.e., two write assistors for each SRAM cell), as will become more apparent by the discussions below and with reference to the subsequent Figures. As discussed above, conventional SRAM devices do not have such a write assist circuit that is embedded in the SRAM cells array 200.

Still referring to FIG. 4, a plurality of p-type wells (PW) and a plurality of n-type wells (NW) are located in the SRAM cell layout area 400 and in the write assist circuit layout area 401. A plurality of fin structures is formed over the PW and the NW. For example, the SRAM cell layout area 400 may include fin structures 410-419, and the write assist circuit layout area 401 may include fin structures 430-435. The fin structures 410-419 and 430-435 each extend in an elongated manner in an X-direction in the top view of FIG. 4. In some embodiments, the fin structures 410-419 and 430-435 include vertically protruding semiconductor fin structures of FinFET devices. The fin structures 410-419 and 430-435 may be considered the active regions.

Figure 5:
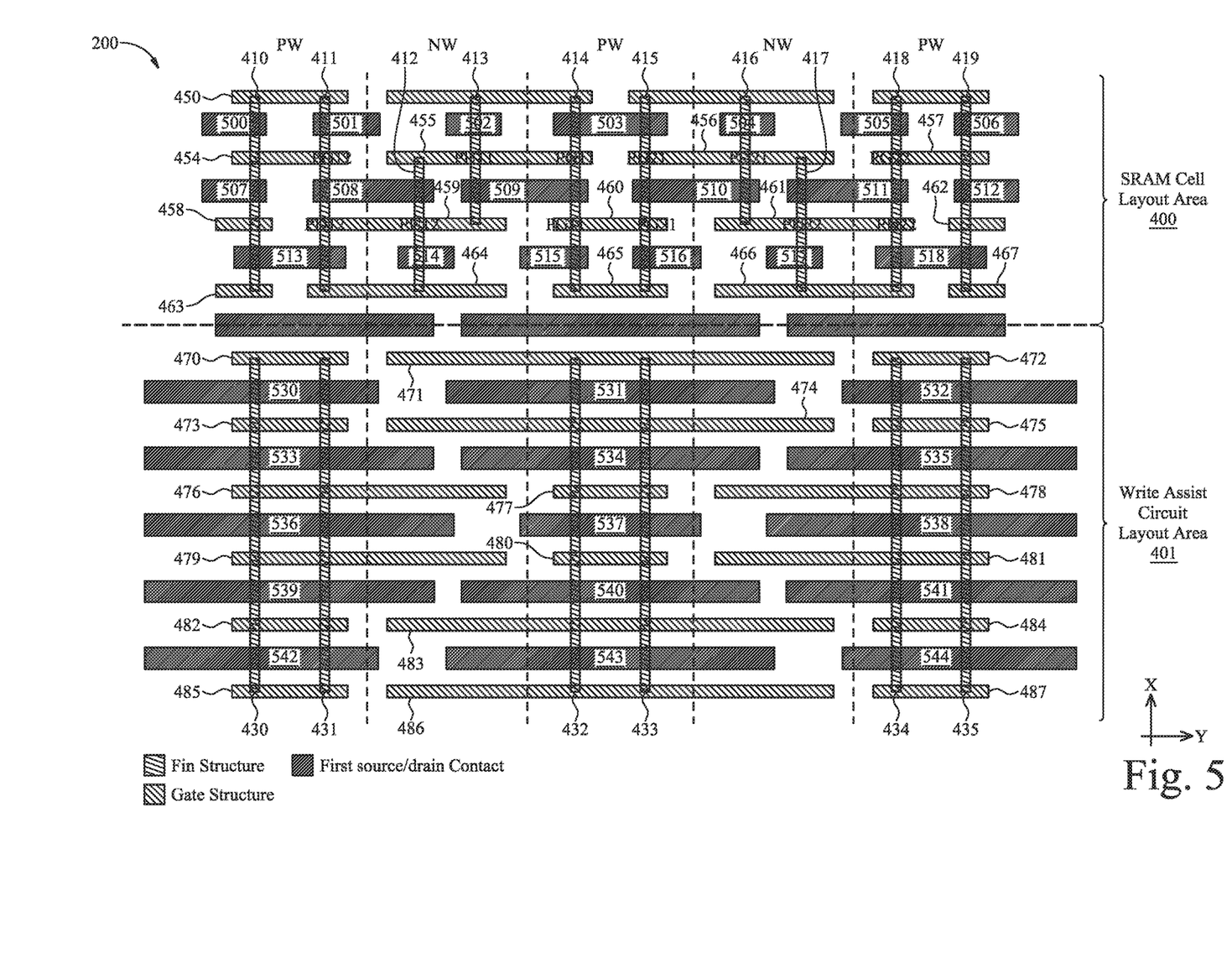

Referring to FIGS. 4-5, a plurality of gate structures is formed over (and partially wrap around) the fin structures 410-419 and 430-435. For example, gate structures 450-467 are formed in the SRAM cell layout area 400, and gate structures 470-487 are formed in the write assist circuit layout area 401. For reasons of simplicity, not all of the gate structures are specifically labeled in FIG. 4, though they are labeled in FIG. 5. It is understood that both the SRAM cell layout area 400 and the write assist circuit layout area 401 shown in FIGS. 4-5 are parts of the SRAM cells array 200 of FIG. 2. In other words, the transistors and metal interconnections in the write assist circuit layout area 401 will follow the same set of design rules (e.g., including but not limited to pitch, width, spacing, etc.) that also govern the layout of the transistors and metal interconnections in the SRAM cell layout area 400. In contrast, conventional devices may implement a write assist circuit in a portion of the chip that is similar to the logic circuit region 120 discussed above with reference to FIG. 2. Since the logic circuit region 120 and the SRAM cells array 200 (e.g., including both the SRAM cell layout area 400 and the write assist circuit layout area 401) have different design rules, the write assist circuit implemented in conventional devices may have a different layout than their SRAM cells. In some embodiments, compared to the logic circuit region 120's design rules, the SRAM cells array 200's design rules allow for tighter spacings between various features such as fin-to-fin spacings, contact-to-contact spacings, metal-line-to-metal-line spacings, etc. As such, the same type of circuit implemented in the SRAM cells array 200 corresponds to a smaller footprint than in the logic circuit region 120.

In some embodiments, the gate structures 450-467 and 470-487 are high-k metal gate (HKMG) structures. For example, they may each include a high-k gate dielectric (e.g., a dielectric material with a dielectric constant greater than about 3.9) and a metal gate electrode. In the top view of FIG. 4, The gate structures 450-467 and 470-487 each extend in an elongated manner in a Y-direction that is perpendicular to the X-direction.

A plurality of source/drain contacts is also formed in the SRAM cell layout area 400 and in the write assist circuit layout area 401. For example, the SRAM cell layout area 400 includes a plurality of source/drain contacts 500-518, and the write assist circuit layout area 401 includes a plurality of source/drain contacts 530-544. The source/drain contacts 500-518 and 530-544 each extend in the Y-direction and provide electrical connectivity to the source/drains of transistors in the SRAM cell layout area 400 and in the write assist circuit layout area 401. The source/drain contacts 500-518 and 530-544 may also be referred to as first source/drain contacts.

In some embodiments, the source/drain contacts 500-518 and 530-544 are initially formed as continuous structures and are then divided into separate source/drain contacts by selectively removing portions of the continuous source/drain structures. For example, a plurality of "cut-MD" elements 560-574 may be defined by lithography masks in the SRAM cell layout area 400 and a plurality of "cut-MD" elements 580-589 may be defined by lithography masks in the write assist circuit layout area 401. It is understood that these cut-MD elements 560-574 and 580-589 are not physical structures, and they merely designate the areas along the continuous source/drain contact structures that should be removed. For example, the source/drain contacts 500-506 may have been initially formed as a single continuous structure, but are then divided into separate source/drain contacts by the cut-MD elements 560-565; the source/drain contacts 507-512 may have been initially formed as a single continuous structure, but are then divided into separate source/drain contacts by the cut-MD elements 560, 566-568, and 565; the source/drain contacts 513-518 may have been initially formed as a single continuous structure, but are then divided into separate source/drain contacts by the cut-MD elements 569-571, 567, and 572-574; the source/drain contacts 530-532 may have been initially formed as a single continuous structure, but are then divided into separate source/drain contacts by the cut-MD elements 580-581; the source/drain contacts 533-535 may have been initially formed as a single continuous structure, but are then divided into separate source/drain contacts by the cut-MD elements 582-583; the source/drain contacts 536-538 may have been initially formed as a single continuous structure, but are then divided into separate source/drain contacts by the cut-MD elements 584-585; the source/drain contacts 539-541 may have been initially formed as a single continuous structure, but are then divided into separate source/drain contacts by the cut-MD elements 586-587; and the source/drain contacts 542-544 may have been initially formed as a single continuous structure, but are then divided into separate source/drain contacts by the cut-MD elements 588-589.

FIG. 5 illustrates the SRAM cell layout area 400 and the write assist layout area 401 without the cut-MD elements 560-574 and 580-589 of FIG. 4. FIG. 5 clearly shows that the source/drain contacts 500-518 and 530-544 are separated from one another, after the portions of the continuous source/drain contact structures are selectively removed (e.g., by etching) based on the locations of the cut-MD elements 560-574 and 580-589. Again, the cut-MD elements 560-574 and 580-589 are not physical structures formed on the wafer, but they may be reflected on the lithography mask, so as to define the "breaking up" of the initially continuous source/drain contact structures. It is also understood that the spaces between the adjacent source/drain contacts 500-518 and 530-544 may eventually be filled by a dielectric material, for example an interlayer dielectric (ILD), which may contain a low-k dielectric material or another suitable dielectric material.

Figure 6:
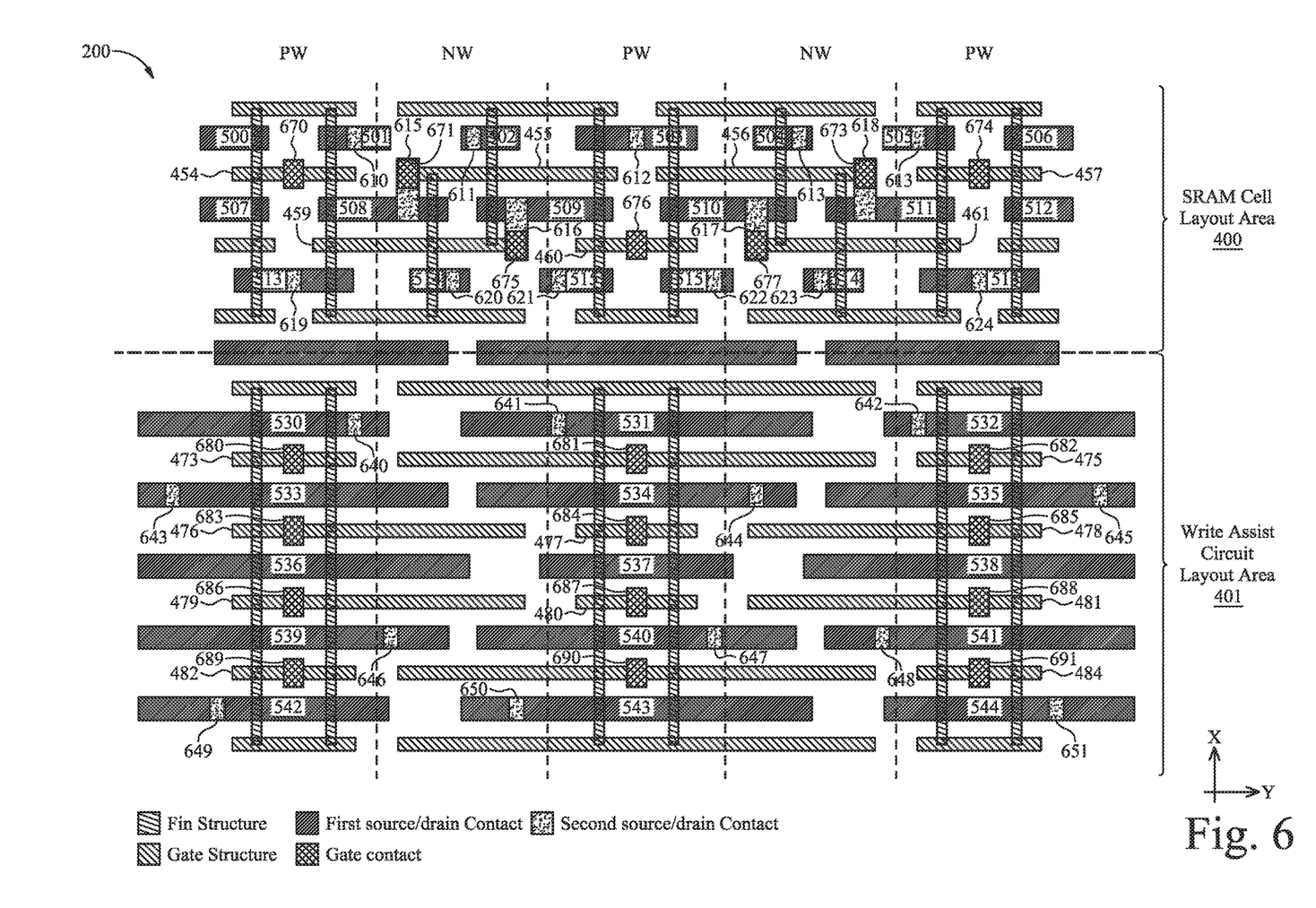

Referring now to FIG. 6, a plurality of additional source/drain contacts 610-624 is formed in the SRAM cell layout area 400, and a plurality of additional source/drain contacts 640-651 is formed in the write assist circuit layout area 401. The source/drain contacts 610-624 are formed on or over the source/drain contacts 501-505, 508-511, and 513-518, respectively. The source/drain contacts 640-651 are formed on or over the source/drain contacts 530-535 and 539-544, respectively. Since the source/drain contacts 610-624 and 640-651 are formed over other respective source/drain contacts, they may also be referred to as second source/drain contacts. The source/drain contacts 610-624 and 640-651 may also be referred to as source/drain vias, since they will electrically interconnect the respective source/drain contacts disposed therebelow with metal lines that will be formed thereabove.

In addition, a plurality of conductive gate contacts is formed over some of the gate structures. For example, in the SRAM cell layout area 400, gate contacts 670-677 are formed over the gate structures 454-457 and 459-461, respectively. In the write assist circuit, gate contacts 680-691 are formed over the gate structures 473-484, respectively. The gate contacts 670-677 and 680-691 provide electrical connectivity to the gate structures 454-457, 459-461, and 473-484, respectively.

Figure 7:
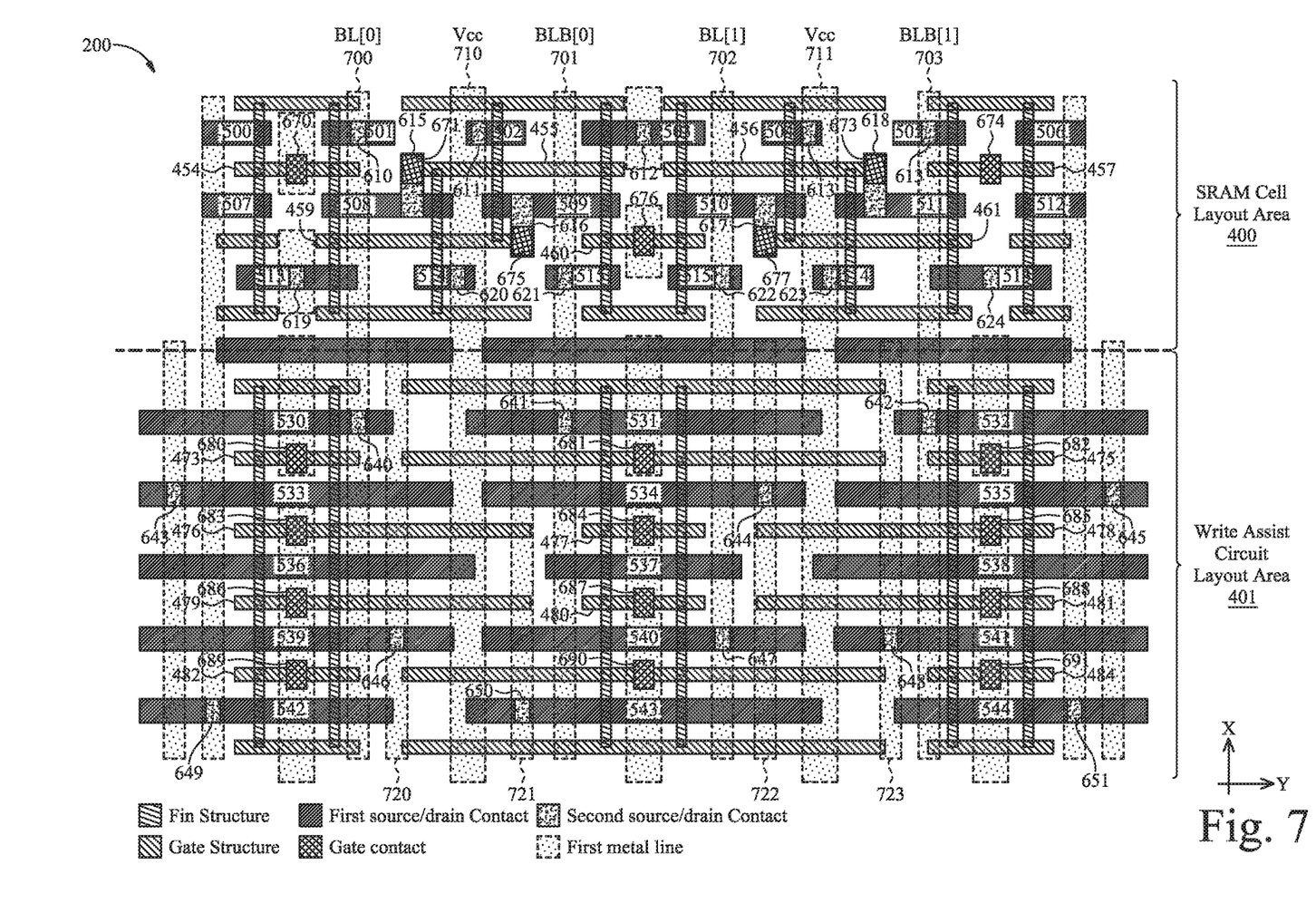

Referring now to FIG. 7, a plurality of metal lines is formed, for example metal lines 700-703, 710-711, and 720-723 that each extend in the X-direction. Note that for reasons of simplicity, not all the metal lines are labeled in FIG. 7. In some embodiments, the metal lines 700-703, 710-711, and 720-723 may be formed in a first metal layer (e.g., metal-0 layer) and therefore may be referred to as first metal lines.

The metal lines 700-703 correspond to BL and BLB signal lines of the SRAM cells. For example, the metal line 700 corresponds to the bit line signal BL[0], the metal line 701 corresponds to the bit line bar signal BLB[0], the metal line 702 corresponds to the bit line signal BL[1], and the metal line 703 corresponds to the bit line bar signal BLB[1]. The metal lines 710 and 711 correspond to a Vcc rail of the SRAM cells.

The metal lines 720-723 correspond to the various "write assist signal lines" that are uniquely implemented according to the various aspects of the present disclosure. In more detail, the metal line 720 corresponds to the WA_BL[0] "write assist signal line", the metal line 721 corresponds to the WA_BLB[0] "write assist signal line", the metal line 722 corresponds to the WA_BL[1] "write assist signal line", and the metal line 723 corresponds to the WA_BLB[1] "write assist signal line". As discussed above, when the write assist circuit 300 is activated during a write cycle of the SRAM, these "write assist signal lines" WA_BL[0], WA_BLB[0], WA_BL[1], and WA_BLB[1] provide alternate paths to, or are electrically coupled in parallel with, the BL[0], BLB[0], BL[1], and BLB[1] signal lines, respectively. In other words, during a write cycle of the SRAM, the metal lines 720-723 are electrically coupled in parallel with the metal lines 700-703, respectively.

In the embodiment of FIG. 7, the metal lines 720-723 are mostly located in the write assist circuit layout area 401, whereas the metal lines 700-703 are located in both the SRAM cell layout area 400 and the write assist circuit layout area 401. As such, the metal lines 720-723 are substantially shorter than the metal lines 700-703. However, this arrangement is not intended to be limiting. In other embodiments, the metal lines 720-723 may also extend at least partially into the SRAM cell layout area 400. For example, in some embodiments, the metal lines 720-723 may have similar lengths (e.g., dimensions in the X-direction) as the metal lines 700-703. In some embodiments, the metal lines 720-723 may also have similar widths (e.g., dimensions in the Y-direction) as the metal lines 700-703. The similarity in the dimensions between these metal lines 700-703 and 720-723 also help with fabrication processing, since pattern uniformity is improved.

Note that the metal lines 720-723 may or may not be formed in the same metal layer as the metal lines 700-703. For example, in some embodiments, the metal lines 700-703 may be formed in a metal-0 layer, while the metal lines 720-723 may be formed in a metal-2 layer, which is two levels above the metal-0 layer (e.g., with the metal-1 layer in between).

It is also understood that FIG. 7 merely shows partial top views of two columns of the SRAM cells (e.g., SRAM cell columns $C_0$ and $C_1$). However, the layout configuration of the metal lines 700-703 and 720-723 may repeat periodically for the rest of the columns of the SRAM cell (e.g., extending to the columns to the "right" than what is shown in FIG. 7). Again, there is a BL signal and a BLB signal for each SRAM cell column, and therefore two write assist signals for each SRAM cell column as well.

Figure 8:
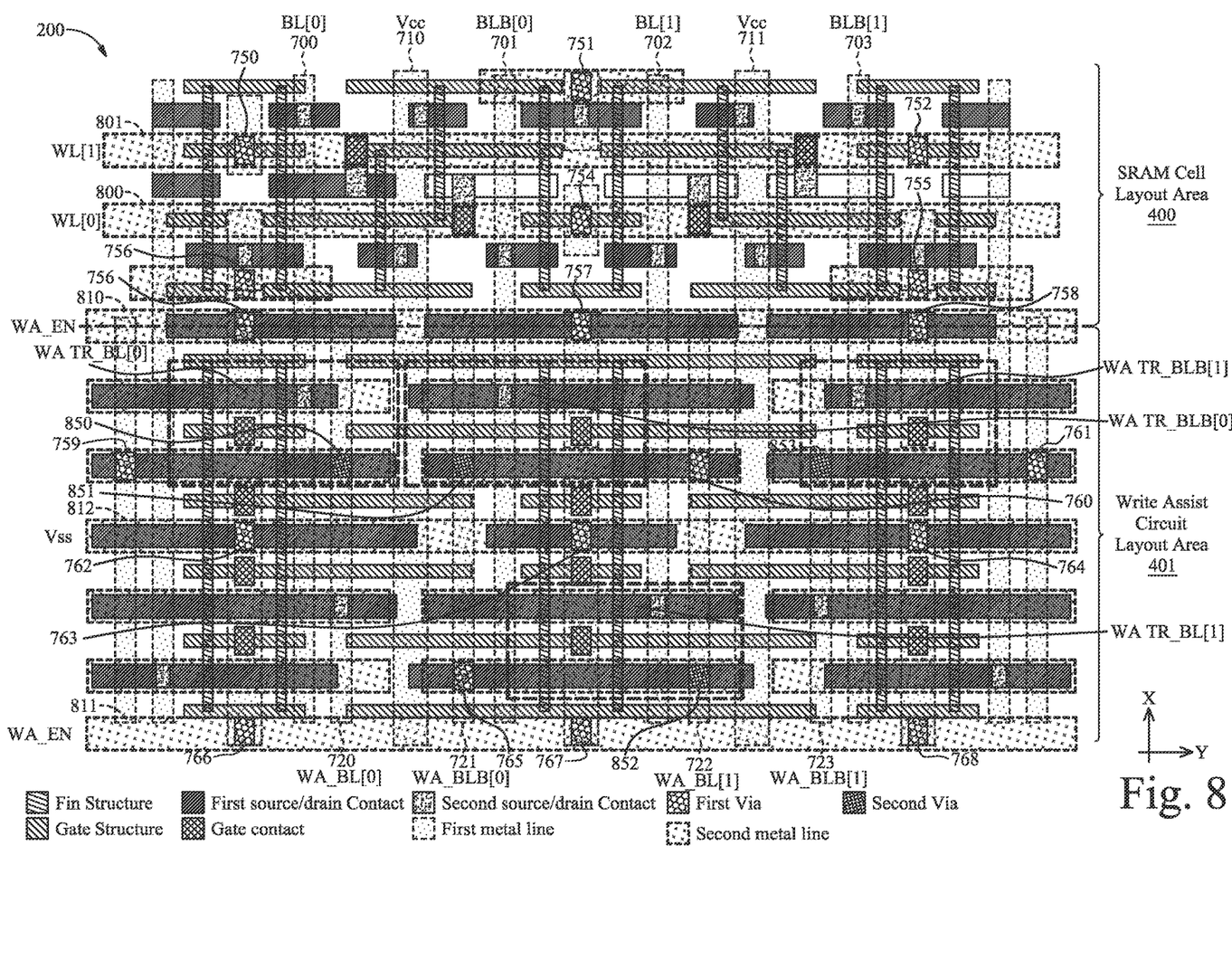

Referring now to FIG. 8, a plurality of vias are formed, for example vias 750-755 in the SRAM cell layout area 400 and vias 756-768 in the write assist circuit layout area 401. These vias 750-755 and 756-768 may be referred to as first vias. A plurality of metal lines is also formed, for example metal lines 800-801 in the SRAM cell layout area 400 and metal lines 810-812 in the write assist circuit layout area 401. The metal lines 800-801 and 810-812 each extend in the Y-direction. The metal lines 800 and 801 correspond to the "word line" signals WL[0] and WL[1] of the SRAM cells array 200, respectively. The metal lines 810-811 each corresponds to the control signal line WA_EN discussed above with reference to FIGS. 2-3. A plurality of vias 850-853 is also formed in the write assist circuit layout area 401. The vias 850-853 are formed over, and provide electrical connectivity to, the metal lines 720-723, respectively. The vias 850-853 may also be referred to as second vias.

In a "write" cycle of the SRAM, the control signal line WA_EN (e.g., metal lines 810-811) is at a logic high. In response to the logic high of WA_EN, the write assist transistors (e.g., the four transistors WA TR_BL[0], WA TR_BLB[0], WA TR_BL[1], and WA TR_BLB[1] shown with the dashed boxes in FIG. 8) are enabled (or turned on), which allow the meta lines 720-723 to be electrically coupled in parallel with the metal lines 700-703, respectively. As discussed above, such a parallel electrical coupling provides additional path for the BL and BLB signal lines, which effective reduces their respective parasitic resistances and in turn optimizes SRAM device performance, for example with respect to a write margin.

In a "read" cycle of the SRAM, the control signal line WA_EN is at a logic low. In response to the logic low of WA_EN, the write assist transistors are disabled (or turned off), which cuts off the parallel electrical connection between the meta lines 720-723 and the metal lines 700-703, respectively. The SRAM functions as if the write assist circuit 300 did not exist. As such, the write assist circuit does not contribute to the parasitic capacitance during the "read" cycle, and this prevents the SRAM from being slowed down by the parasitic capacitance, since speed is a more important concern in the "read" cycle of the SRAM.

Also, it can be seen based on the top view shown in FIG. 8 that the layout between the SRAM and the write assist circuit are similar, for example with respect to the dimensions of the various fin structures, gate structures, metal lines, and vias in both the X-direction and Y-direction. In some embodiments, the same design rules are followed in the SRAM cell layout area 400 and in the write assist circuit layout area 401, which means that the sizes and spacing of the various components between these two layout areas may be similar.

In some embodiments, the fin structures of the SRAM and the fin structures of the write assist circuit have similar dimensions (e.g., +/−10%) in the Y-direction, the gate structures of the SRAM and the gate structures of the write assist circuit have similar dimensions (e.g., +/−10%) in the X-direction, the metal lines of the SRAM and the metal lines of the write assist circuit have similar dimensions (e.g., +/−10%) in the Y-direction, and the vias of the SRAM and the vias of the write assist circuit have similar dimensions (e.g., +/−10%) in both the X-direction and the Y-direction. In addition, the relative dispositions of these fin structures, gate structures, metal lines, and/or vias are also similar between the SRAM and the write assist circuit. Due to these layout similarities, it is easier to fabricate the write assist circuit 300 herein (e.g., within the SRAM region 110), as opposed to having to implement it in the logic circuit region 120 or another region that is outside of the SRAM region 110. In other words, by leveraging a layout that is similar to the SRAM cells, the write assist circuit 300 herein can be fabricated with enhanced fabrication processing control, since there is greater pattern uniformity.

Figure 9:
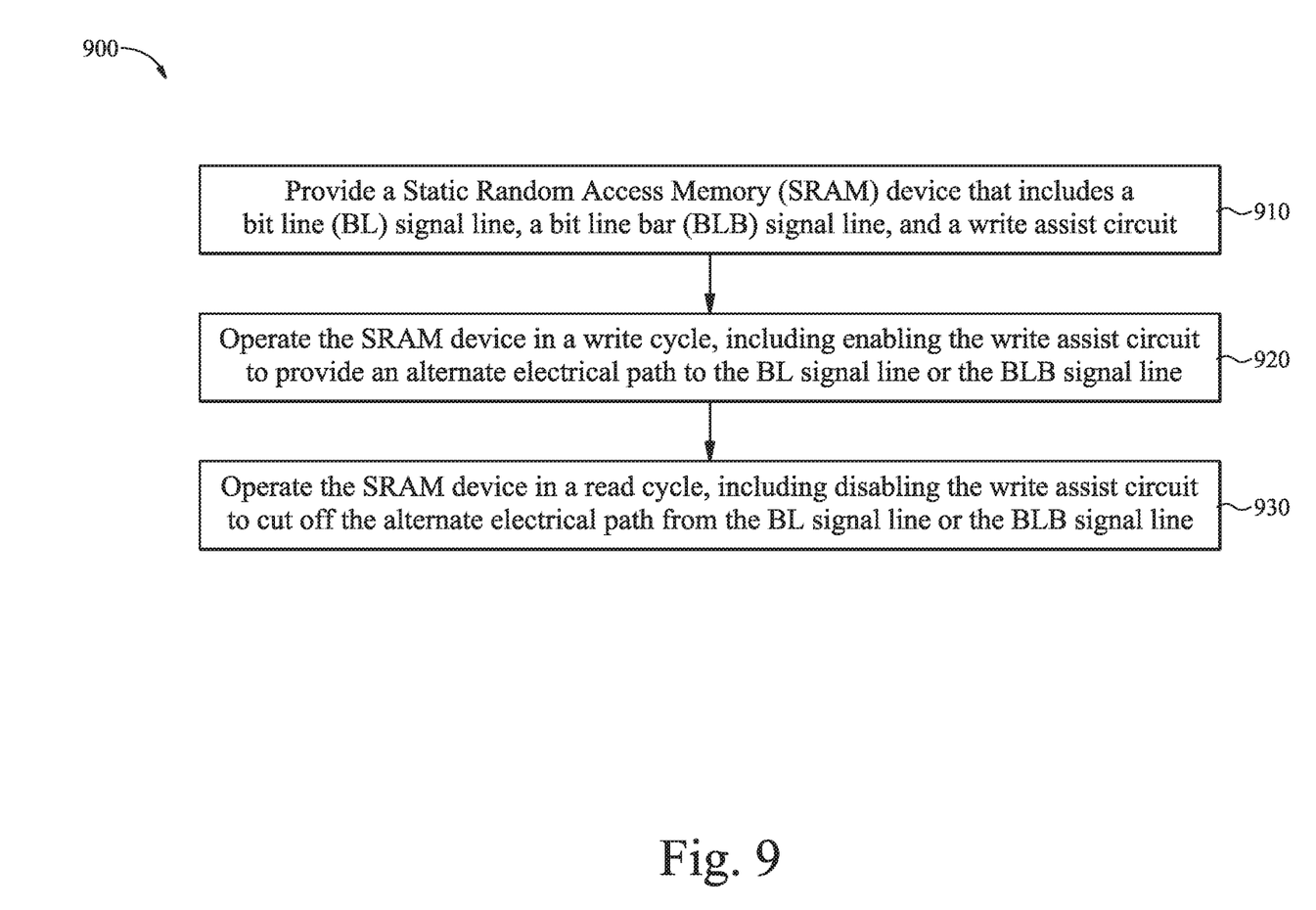
FIG. 9 illustrates a flowchart of a method of operating a memory device according to various aspects of the present disclosure.

FIG. 9 is a flowchart illustrating a method 900 of operating a memory device. The method 900 includes a step 910 to provide a Static Random Access Memory (SRAM) device that includes a bit line (BL) signal line, a bit line bar (BLB) signal line, and a write assist circuit.

The method 900 includes a step 920 to operate the SRAM device in a write cycle, including enabling the write assist circuit to provide an alternate electrical path to the BL signal line or the BLB signal line.

The method 900 includes a step 930 to operate the SRAM device in a read cycle, including disabling the write assist circuit to cut off the alternate electrical path from the BL signal line or the BLB signal line.

In some embodiments, the SRAM device includes an SRAM region and a logic circuit region. The SRAM region includes an SRAM cells array and the write assist circuit. The logic circuit region includes logic circuitry.

In some embodiments, the operating of the SRAM device includes generating a control signal having a first logic state and a second logic state. The write assist circuit is enabled in response to the control signal having the first logic state and disabled in response to the control signal having the second logic state.

In some embodiments, the write assist circuit includes a transistor having a gate, a first source/drain, and a second source/drain. The gate is coupled to the control signal. The first source/drain is coupled to the BL signal line or the BLB signal line. The second source/drain is coupled to a signal line that is neither the BL signal line nor the BLB signal line.

It is understood that the method 900 may include additional steps performed before, during, or after the steps 910-930. For reasons of simplicity, however, these additional steps are not discussed in detail herein.

In summary, the present disclosure implements a write assist circuit that is effectively embedded in the SRAM array. The write assist circuit is enabled during a "write" cycle of the SRAM array in response to a first logic state of a control signal (e.g., the signal WA_EN being at a logic high). When the write assist circuit is enabled, it electrically couples the signal lines BL and BLB in parallel with additional signal lines such as WA_BL and WA_BLB, respectively. The write assist circuit is disabled during a "read" cycle of the SRAM array in response to a second logic state of the control signal (e.g., the signal WA_EN being at a logic low). When the write assist circuit is disabled, the signal lines BL and BLB are no longer coupled in parallel electrically with the additional signal lines such as WA_BL and WA_BLB.

Based on the above discussions, it can be seen that the embodiments of the present disclosure offer advantages over conventional devices. It is understood, however, that no particular advantage is required, other embodiments may offer different advantages, and that not all advantages are necessarily disclosed herein.

On advantage is improved device performance. For example, as device scaling continues, the size of SRAM array becomes greater, and meanwhile the microelectronic elements such as the width of metal lines become smaller. As a result, parasitic resistance across the length of BL or BLB signal lines is no longer negligible but may cause a substantial voltage loss as the voltage signal travels through the length of BL or BLB signal lines. For example, in a write cycle, the SRAM cells located at the far end (i.e., away from the circuit that generates the logic signals for BL or BLB) may experience a significantly degraded voltage signal compared to the SRAM cells located at the near end. If left unabated, such voltage loss for the far end SRAM cells could degrade device performance such as write margin or speed. The present disclosure solves this problem by implementing a write assist circuit that is selectively turned on and off as discussed above. Since the write assist circuit (when enabled during the "write" cycle) allows the signal lines BL and BLB to be electrically coupled in parallel with additional signal lines, it effectively reduces the parasitic resistance of the BL and BLB signal lines, thereby minimizing the voltage loss caused by the parasitic resistance. As such, device performance is improved, for example with respect to a write margin of the SRAM. During the "read" cycle, parasitic resistance is not a significant concern, but speed is a more important concern, and thus it would be undesirable to increase parasitic capacitance needlessly, as extra parasitic capacitance reduces speed. Here, by cutting off the electrical connections between the signal lines BL/BLB from WA_BL/WA_BLB, the write assist circuit does not unduly increase parasitic capacitance. Therefore, the speed of the SRAM is substantially unaffected in the "read" cycle even with the implementation of the write assist circuit. Another advantage is the ease of implementation of the write circuit due to better layout uniformity between the write assist circuit and the SRAM cells. In other words, it is easier to perform fabrication processing control herein, as opposed to having a write assist circuit implemented elsewhere on the IC chip, such as in a logic device region and not in the SRAM region.

Based on the above, it is understood that FinFETs for different circuits such as core (logic) circuits, Static Random Access Memory (SRAM) circuits, and Input-Output devices may face different problems with the increasing downscaling of integrated circuits. The SRAM device herein has a switching memory cell that includes a transistor device and assist bitline electrode, a switching memory active volume, and a selection transistor connected in series between the bitline electrode and the assist bitline electrode. The core (logic) FinFET device for assist circuits may be connected to the SRAM cells 210 and 211. Core (logic) FinFET assist circuit may be a p-type transistor or an n-type transistor.

One embodiment of the present disclosure involves a memory device. The memory device includes a plurality of memory cells located in a first region of the memory device. The memory cells include a first signal line. The memory device includes a first circuit located in the first region of the memory device. The memory device includes a plurality of logic circuits located in a second region of the memory device. The second region is different from the first region. The first circuit is configured to be selectively enabled and disabled. When the first circuit is enabled, the first signal line is electrically coupled in parallel with a second signal line.

Another embodiment of the present disclosure involves an SRAM device. The SRAM device includes an array of SRAM cells. The SRAM device includes a bit line (BL) signal line and a bit line bar (BLB) signal line that are each coupled to the array of SRAM cells. The SRAM device includes a first signal line and a second signal line. The SRAM device includes a write assist circuit. The write assist circuit, when enabled, electrically couples the BL signal line with the first signal line in parallel, and electrically couples the BLB signal line with the second signal line in parallel.

Yet another embodiment of the present disclosure involves a method of operating a memory device. The method includes providing a Static Random Access Memory (SRAM) device that includes a bit line (BL) signal line, a bit line bar (BLB) signal line, and a write assist circuit. The method includes operating the SRAM device in a write cycle, including enabling the write assist circuit to provide an alternate electrical path to the BL signal line or the BLB signal line. The method includes operating the SRAM device in a read cycle, including disabling the write assist circuit to cut off the alternate electrical path from the BL signal line or the BLB signal line.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a plurality of memory cells located in a first region of the memory device, wherein the memory cells include a first signal line;
a first circuit located in the first region of the memory device; and
a plurality of logic circuits located in a second region of the memory device;
wherein:
the second region and the first region have different design rules;
the memory device has a read cycle and a write cycle;
the first circuit is configured to be enabled in the write cycle and disabled in the read cycle; and
when the first circuit is enabled, the first signal line is electrically coupled with a second signal line simultaneously.

2. The memory device of claim 1, wherein when the first circuit is disabled, the first signal line is electrically isolated from the second signal line.

3. The memory device of claim 1, wherein:
the memory cells each include a Static Random Access Memory (SRAM) cell;
the first signal line includes a bit line (BL) or a bit line bar (BLB); and
the second signal line is neither the BL nor the BLB.

4. The memory device of claim 1, wherein:
at least one of the logic circuits is configured to generate a control signal;
the first circuit is enabled when the control signal is at a first logic state;
the first circuit is disabled when the control signal is at a second logic state opposite the first logic state;
the first circuit includes a transistor having a gate, a first source/drain, and a second source/drain;
the gate is electrically connected to the control signal;
the first source/drain is electrically connected to the first signal line; and
the second source/drain is electrically connected to the second signal line.

5. The memory device of claim 1, wherein a design rule of the first region specifies tighter spacings than a design rule of the second region.

6. The memory device of claim 1, wherein:
the memory device includes an interconnect structure having a plurality of metal layers; and
the first signal line and the second signal line are located in different ones of the metal layers.

7. The memory device of claim 6, wherein:
the metal layers include at least a metal-0 layer, a metal-1 layer disposed above the metal-0 layer, and a metal-2 layer disposed above the metal-1 layer;
the first signal line is disposed in the metal-0 layer; and
the second signal line is disposed in the metal-2 layer.

8. The memory device of claim 1, wherein:
the memory cells are arranged into an array composed of M number of rows and N number of columns;
M and N are integers; and
the first circuit includes 2×N number of transistors.

9. The memory device of claim 8, wherein each column of the memory cells corresponds to two different ones of the transistors of the first circuit, respectively.

10. The memory device of claim 9, wherein:
each column is electrically coupled to a bit line (BL) and a bit line bar (BLB); and
the two different ones of the transistors of the first circuit for each column include a first transistor that is electrically coupled to the BL and a second transistor that is electrically coupled to the BLB.

11. A Static Random Access Memory (SRAM) device, comprising:
an SRAM region that includes:
an array of SRAM cells;
a bit line (BL) signal line and a bit line bar (BLB) signal line that are each coupled to the array of SRAM cells;
a first signal line and a second signal line; and
a write assist circuit, wherein the write assist circuit, when enabled, electrically couples the BL signal line with the first signal line simultaneously, and electrically couples the BLB signal line with the second signal line simultaneously; and
a logic region that includes one or more logic circuits that are not SRAM cells, wherein the logic region has different design rules than the SRAM region, and wherein design rules of the SRAM region are associated with smaller feature spacing than design rules of the logic region.

12. The SRAM device of claim 11, wherein:
the BL signal line and the BLB signal line are implemented using a first metal layer of an interconnect structure; and
the first signal line and the second signal line are implemented using a second metal layer of the interconnect structure.

13. The SRAM device of claim 11, wherein:
the array of SRAM cells is arranged into a plurality of columns and rows; and
the write assist circuit includes two respective transistors for each column of the array of SRAM cells.

14. The SRAM device of claim 11, wherein:
the SRAM device includes a read cycle and a write cycle; and
the write assist circuit is disabled during the read cycle and enabled during the write cycle.

15. A method, comprising:
providing a Static Random Access Memory (SRAM) device that includes a logic circuit region and an SRAM cells array region, wherein the logic circuit region is free of SRAM cells but contains a row decoder, a column decoder, and a sense amplifier, wherein the SRAM cells array region includes a plurality of SRAM cells and a write assist circuit, and wherein a bit line (BL) signal line and a bit line bar (BLB) signal line extend through the SRAM cells array region;
operating the SRAM device in a write cycle, including enabling the write assist circuit to provide an alternate electrical path to the BL signal line or the BLB signal line; and
operating the SRAM device in a read cycle, including disabling the write assist circuit to cut off the alternate electrical path from the BL signal line or the BLB signal line.

16. The method of claim 15, wherein:
the SRAM device includes an SRAM region and a logic circuit region;

the providing the SRAM device comprises:
  forming an SRAM cells array and forming the write assist circuit in the SRAM region of the SRAM device; and
  forming logic circuitry in the logic circuit region of the SRAM device.

17. The method of claim 15, wherein:
the operating of the SRAM device comprises generating a control signal having a first logic state and a second logic state;
the enabling of the write assist circuit comprises enabling the write assist circuit in response to the control signal having the first logic state; and
the disabling of the write assist circuit comprises disabling the write assist circuit in response to the control signal having the second logic state.

18. The method of claim 17, wherein:
the write assist circuit includes a transistor having a gate, a first source/drain, and a second source/drain; and wherein the providing the SRAM device comprises:
  coupling the gate to the control signal;
  coupling the first source/drain to the BL signal line or the BLB signal line; and
  coupling the second source/drain to a signal line that is neither the BL signal line nor the BLB signal line.

19. The method of claim 15, further comprising:
implementing the BL signal line using a first metal layer of an interconnect structure; and
implementing the BLB signal line using a second metal layer of an interconnect structure, wherein the second metal layer is located above or below the first metal layer.

20. The method of claim 15, wherein the enabling the write assist circuit to provide the alternate electrical path to the BL signal line or the BLB signal line comprises electrically coupling a first signal line with the BLB signal line or with the BLB signal line, wherein the first signal line is different from the BLB signal line and the BLB signal line.

* * * * *